United States Patent
Yuuki et al.

(10) Patent No.: US 8,759,817 B2
(45) Date of Patent: Jun. 24, 2014

(54) ORGANIC LIGHT-EMITTING DEVICE ARRAY AND DISPLAY

(75) Inventors: Osamu Yuuki, Tokyo (JP); Shigeki Kondo, Hiratsuka (JP); Toshiko Morii, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 808 days.

(21) Appl. No.: 11/255,940

(22) Filed: Oct. 24, 2005

(65) Prior Publication Data

US 2006/0091380 A1 May 4, 2006

(30) Foreign Application Priority Data

Oct. 25, 2004 (JP) .................. 2004-309011
Oct. 18, 2005 (JP) .................. 2005-302521

(51) Int. Cl.
*H01L 29/08* (2006.01)

(52) U.S. Cl.
USPC ........ 257/40; 257/98; 257/103; 257/E51.022; 313/506; 313/503; 313/504; 438/28; 438/34; 438/35

(58) Field of Classification Search
USPC .......... 257/40, 98, 103, E51.022; 438/28, 34, 438/35; 313/506
See application file for complete search history.

(56) References Cited

U.S. PATENT DOCUMENTS

| | | | | |
|---|---|---|---|---|
| 4,444,501 A * | 4/1984 | Schwiesow | ................... | 356/452 |
| 5,479,328 A * | 12/1995 | Lee et al. | ................... | 362/216 |
| 5,485,452 A * | 1/1996 | Maeda | ................... | 369/284 |
| 5,554,911 A * | 9/1996 | Nakayama et al. | ............ | 313/504 |
| 6,541,130 B2 * | 4/2003 | Fukuda | .................. | 428/690 |
| 6,828,042 B2 | 12/2004 | Imanishi | .................. | 428/690 |
| 6,831,409 B2 | 12/2004 | Yamada | .................. | 313/506 |
| 6,906,457 B2 * | 6/2005 | Song et al. | .................. | 313/504 |
| 6,917,159 B2 * | 7/2005 | Tyan et al. | .................. | 313/506 |
| 6,993,214 B2 * | 1/2006 | Nishimura et al. | ............. | 385/14 |
| 7,019,331 B2 * | 3/2006 | Winters et al. | .................. | 257/79 |
| 7,023,013 B2 * | 4/2006 | Ricks et al. | .................. | 257/40 |
| 7,102,700 B1 * | 9/2006 | Pease et al. | .................. | 348/744 |
| 7,129,634 B2 * | 10/2006 | Boroson et al. | ............... | 313/504 |

(Continued)

FOREIGN PATENT DOCUMENTS

EP 1 643 809 A1 4/2006
JP 2000-200061 7/2000

(Continued)

OTHER PUBLICATIONS

Dodabalapur et al., "Physics and applications of organic microcavity light emitting diodes", J. Appl. Phys. 80 (12), Dec. 15, 1996, pp. 6954-6964.*

(Continued)

*Primary Examiner* — Lex Malsawma
*Assistant Examiner* — Sheng Zhu
(74) *Attorney, Agent, or Firm* — Fitzpatrick, Cella, Harper & Scinto (57) ABSTRACT

The present invention provides an organic light emitting device array which reduces the change of white balance even if an observation angle is changed. In an organic light emitting device array comprising a plurality of organic light emitting devices which emit lights of different colors, an optical path difference is set such that signs of gradients at an optical path difference of 2 L of interferograms for all the plurality of organic light emitting devices are identical to each other.

20 Claims, 5 Drawing Sheets

(56) References Cited

U.S. PATENT DOCUMENTS

| | | | |
|---|---|---|---|
| 7,187,120 B2 * | 3/2007 | Ohshita et al. | 313/504 |
| 7,196,469 B2 * | 3/2007 | Shore et al. | 313/506 |
| 7,224,114 B2 * | 5/2007 | Yamada et al. | 313/504 |
| 7,247,394 B2 * | 7/2007 | Hatwar et al. | 428/690 |
| 2002/0061418 A1 | 5/2002 | Imanishi | 428/690 |
| 2003/0034938 A1 | 2/2003 | Yamada | 313/506 |
| 2003/0064255 A1 * | 4/2003 | Dannenberg | 428/701 |
| 2003/0090572 A1 * | 5/2003 | Belz et al. | 348/207.1 |
| 2003/0124733 A1 * | 7/2003 | Bushway et al. | 436/174 |
| 2003/0127656 A1 * | 7/2003 | Aizawa et al. | 257/79 |
| 2003/0234608 A1 | 12/2003 | Lee et al. | 313/504 |
| 2004/0164673 A1 * | 8/2004 | Suzuki et al. | 313/506 |
| 2004/0169624 A1 | 9/2004 | Yamazaki et al. | 345/76 |
| 2004/0256983 A1 * | 12/2004 | Hung et al. | 313/506 |
| 2005/0037232 A1 * | 2/2005 | Tyan et al. | 428/690 |
| 2005/0249972 A1 * | 11/2005 | Hatwar et al. | 428/690 |
| 2005/0280008 A1 * | 12/2005 | Ricks et al. | 257/79 |
| 2006/0028133 A1 | 2/2006 | Kondo et al. | 313/512 |
| 2006/0033425 A1 | 2/2006 | Miura et al. | 313/504 |
| 2006/0044226 A1 * | 3/2006 | Liedenbaum et al. | 345/76 |
| 2006/0049419 A1 * | 3/2006 | Tanaka et al. | 257/98 |

FOREIGN PATENT DOCUMENTS

| | | |
|---|---|---|
| JP | 2002-289358 | 10/2002 |
| JP | 2004-031324 | 1/2004 |
| JP | 2004-186111 | 7/2004 |
| JP | 2004-235015 | 8/2004 |
| JP | 2004-236015 | 8/2004 |
| JP | 2004-265691 | 9/2004 |
| JP | 2004-265851 | 9/2004 |

OTHER PUBLICATIONS

Translation of JPP 2002-367770, Laid-Open of Dec. 20, 2002.
Translation of JPP 2002-110363, Laid-Open of Apr. 12, 2002.
Partial English Translation of JP 2002-289358 filing date Oct. 4, 2002.

* cited by examiner

OPTICAL PATH DIFFERENCE

FIG. 4

OPTICAL PATH DIFFERENCE

ORGANIC LIGHT-EMITTING DEVICE ARRAY AND DISPLAY

BACKGROUND OF THE INVENTION

1. Field of the Invention

The present invention relates to an organic light emitting device array and a display which are capable of full color light emission and white light emission.

2. Related Background Art

In recent years, development of organic electroluminescence (organic EL; OLED) technology is active. Then, attention has been paid to the problem that the luminescent color changes between the case where a light emitting device utilizing such technology is viewed from the front and the case where the device is viewed from an oblique angle. Japanese Patent Application Laid-Open No. 2002-110363 discloses a device for reducing a spectral change depending on a change of the viewing angle by controlling orientation of a luminescent material.

On the other hand, Japanese Patent-Application Laid-Open No. 2002-367770 discloses a technique for reducing a white color shift while paying attention to that the white color shift arises due to a shift of wavelength, decrease of luminescence intensity, and the like depending on the change of viewing angle. More specifically, it discloses determining a position of a translucent reflective layer in a film thickness direction such that a peak wavelength of internal emission spectrum of a light emitting layer and a peak wavelength of multiple interference filter spectrum by a resonance portion are offset with respect to each other.

Nevertheless, Japanese Patent Application Laid-Open No. 2002-110363 has not paid attention to the problem of a white color shift when performing color mixing using light emitting devices of different luminescent colors.

In addition, Japanese Patent Application Laid-Open No. 2002-367770 relates to an organic light emitting device which has a resonance structure utilizing multiple interference and which, because of having the resonance structure, is directed to a structure suitable for a device showing a strong luminous intensity only when viewed from the front.

SUMMARY OF THE INVENTION

The present invention relates to an organic light emitting device array with a structure which does not utilize multiplex interference and does not force directivity of light, and it is an object of the present invention to provide an organic light emitting device array which has reduced color shift in color mixing even when the viewing angle is changed, and a display having the same.

In order to attain the object, according to a first aspect of the present invention, there is provided an organic light emitting device array comprising a plurality of organic light emitting devices of different emission light colors each comprising a first electrode disposed on a transmission side, a second electrode disposed on a reflection side, and a light emitting layer disposed between the first and the second electrodes, wherein when an optical path between a light emitting position and a reflecting position is defined as L, signs of gradients at an optical path difference of 2 L of interferograms for the plurality of organic light emitting devices are identical to each other.

In addition, according to a second aspect of the present invention, there is provided an organic light emitting device array comprising a plurality of organic light emitting devices of different emission light colors each comprising a first electrode disposed on a transmission side, a second electrode disposed on a reflection side, and a light emitting layer disposed between the first and the second electrodes, wherein a member disposed on the transmission side of the light emitting layer has a reflectance of less than 50%, and wherein a difference between a CIE chromaticity coordinate for pure white color when the array is viewed from a direction perpendicular to a front face thereof and a CIE chromaticity coordinate for pure white color when the array is viewed from a direction inclined at 60° relative to the perpendicular direction is 0.05 or less in terms of x-coordinate and y-coordinate, respectively.

The present invention can provide an organic light emitting device array which has reduced color shift in color mixing even when the viewing angle is changed, without adopting a resonator structure.

DETAILED DESCRIPTION OF THE PREFERRED EMBODIMENTS

In an organic light emitting device array according to a preferred embodiment, when an optical path between a light emitting position and a reflecting position is defined as L, the signs of gradients at an optical path difference of 2 L of interferograms of a plurality of organic light emitting devices are identical to each other.

The term "interferogram" herein employed refers to change of interference light intensity as a function of optical path difference. Thus, an interferogram is a curve expressed with optical path difference as abscissa and interference light intensity as ordinate and shows a periodic waveform.

In addition, an organic light emitting device array according to another preferred embodiment is an organic light emitting device array comprising a plurality of organic light emitting devices of different emission light colors each comprising a first electrode disposed on a transmission side, a second electrode disposed on a reflection side, and a light emitting layer disposed between the first and the second electrodes, wherein a member disposed on the transmission side of the light emitting layer has a reflectance of less than 50%, and wherein a difference between a CIE chromaticity coordinate for pure white color when the array is viewed from a direction perpendicular to a front face thereof and a CIE chromaticity coordinate for pure white color when the array is viewed from a direction inclined at 60° relative to the perpendicular direction is 0.05 or less in terms of x-coordinate and y-coordinate, respectively.

Figure 1:
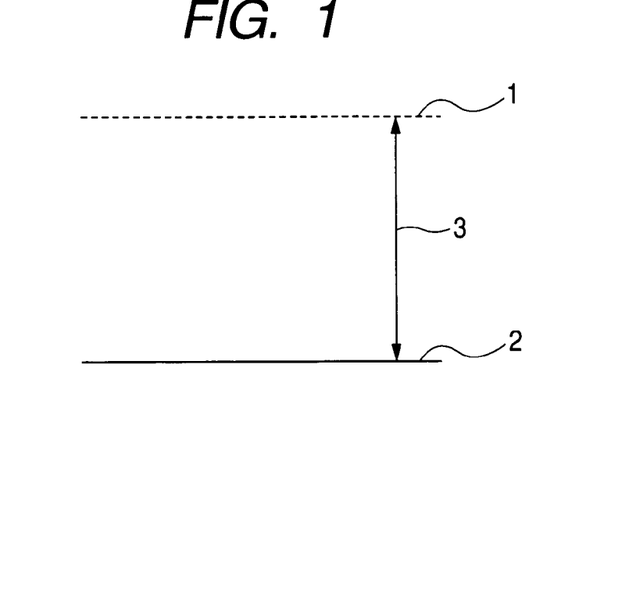
FIG. 1 is a schematic conceptual view for explaining a light emitting position, a reflection position, and an optical path L.

FIG. 1 is a schematic conceptual view for explaining a light emitting position, a reflecting position, and an optical path L of an organic light emitting device array in accordance with this embodiment. Reference numeral 1 denotes a light emitting position, reference numeral 2 denotes a reflecting position, and reference numeral 3 denotes a thickness d between the light emitting position and reflecting position. In the figure, the upper side is a light taking out side. A light emitting position is located in an organic layer arranged between a pair of electrodes of an organic light emitting device. Specifically, the light emitting position is within an organic light emitting layer, or at an interface of two organic layers, or in the vicinity of such an interface. More specifically, the light emitting position is, for example, at an interface with a hole transporting layer in the light emitting layer or in the vicinity of the interface.

A light from the light emitting position 1 is reflected from the reflecting position 2, and exits to the light taking out side.

The reflecting position is located on a surface on the light taking out side of a reflective layer. When either one of the pair of electrodes is a reflective electrode, the reflecting position is on a surface on the light taking out side of the reflective electrode. Further, in the present invention, a reflective electrode does not need to be necessarily provided, and alternatively, a transparent electrode and an underlying reflective layer may be just provided. In that case, the reflecting position is on a surface on the transparent electrode side of the reflective layer.

The portion between the light emitting position and the reflecting position may be constituted of a plurality of layers.

As for the optical path L between the light emitting position and the reflecting position, when the portion between the light emitting position and the reflecting position is constituted of a single layer, it is possible to obtain L=nd by applying a refractive index n of the layer as such. When two or more layers exist therebetween, it is possible to obtain the optical path L between the light emitting position and reflecting position by calculating the optical path of each layer respectively and summing them up.

The case where the optical path difference becomes 2 L in the present invention means the case of viewing the array from the front. The term "optical path difference" herein employed means a difference between an optical path of a route along which a light emitted from a light emitting position exits to the light transmission side and an optical path of a route along which a light emitted from a light emitting position to the reflection side is reflected at a reflecting position to exit to the light transmission side. Generally, when an angle of reflection at a reflecting position is represented by $\theta$, the optical path difference can be expressed as $2nd \cos \theta$. For a light which exits perpendicularly to a front face of the array, because the angle of reflection is $\theta=0°$, and further because $\cos \theta=1$ holds, the optical path difference will become 2nd, i.e., 2 L.

Figure 2:
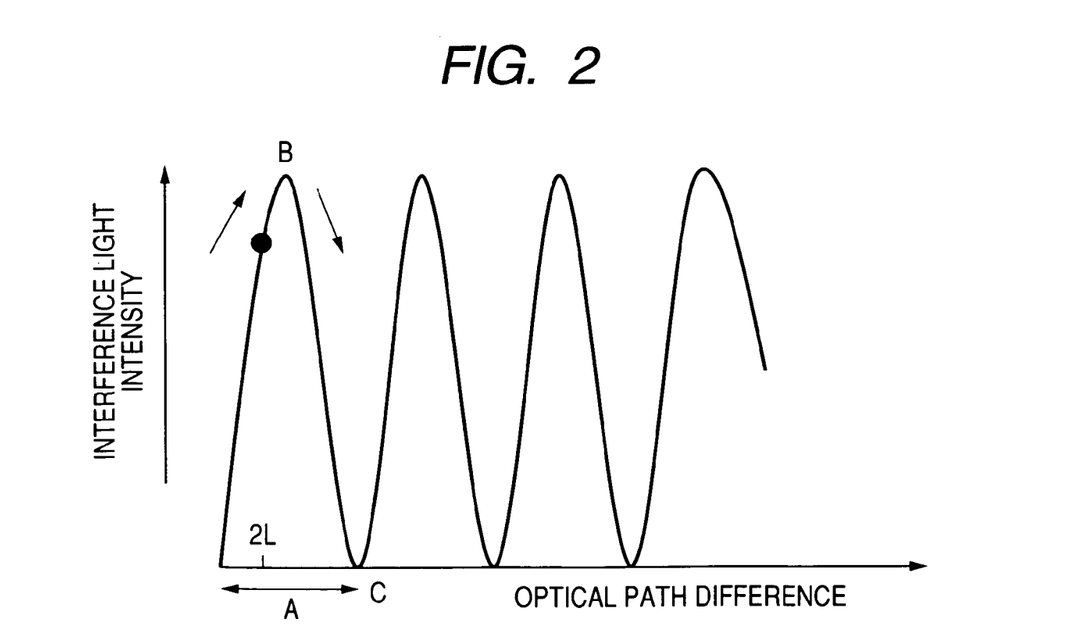
FIG. 2 is a graphic representation for explaining an interferogram which shows a relation of interference light intensity to optical path difference.

FIG. 2 is a graphic representation showing an interferogram which shows a relationship of interference light intensity to optical path difference of one organic light emitting device of an organic light emitting device array in accordance with this embodiment. In the figure, the abscissa indicates the optical path difference and the ordinate indicates the intensity.

As shown in the figure, the interferogram has a plurality of cycles. In the figure, a first cycle is represented by A, a peak of the first cycle is designated by B, and a bottom between the first cycle and a second cycle is designated by C.

The peak B of the crest of the first cycle corresponds to ¼ of an emission wavelength $\lambda$. The peak of the crest of the adjacent cycle corresponds to $3\lambda/4$.

In the present invention, the expression that the sign of the gradient at an optical path difference of 2 L of an interferogram is positive means that the interference light intensity when the optical path difference becomes 2 L is in the middle of a curve going up a crest of a cycle of the interferogram as shown by an upward arrow in the figure. On the other hand, the expression that the sign of the gradient at an optical path difference of 2 L of an interferogram is negative means that the interference light intensity when the optical path difference becomes 2 L is in the middle of a curve going down a trough of a cycle of the interferogram as shown by a downward arrow in the figure. In FIG. 2, as an example, the case where the sign of the gradient at an optical path difference of 2 L of an interferogram is positive is shown by a solid circle. Then, a point corresponding to 2 L is depicted on the abscissa which indicates the optical path difference. Thus, the gradient of the interferogram when the optical path difference is 2 L can be judged with the position of the solid circle, and in this case, the gradient is a positive.

Although the organic light emitting device array in accordance with this embodiment has a plurality of organic light emitting devices which emit lights of colors different from each other, the interferogram of each of the organic light emitting devices is as schematically shown in FIG. 2.

Then, in the organic light emitting device array in accordance with this embodiment, the optical path difference is set such that the signs of the gradients of interferograms at an optical path difference of 2 L of the respective organic light emitting devices are the same as each other.

In consequence, even when the organic light emitting device array is viewed obliquely, because the intensities of the respective colors increase or decrease together, it is possible to reduce the change of white balance depending on the viewing angle.

In the organic light emitting device array in accordance with this embodiment, it is preferable that a position where the optical path difference of each of the organic light emitting devices becomes 2 L is in the middle of a curve of a positive gradient and is nearer to the origin of the abscissa than the point corresponding to $\lambda/4$.

A more preferable position where the optical path difference becomes 2 L is a position which corresponds to a wavelength shorter by 1 to 83 nm than the crest peak wavelength, at which the emission intensity is 40 to 99% with the maximum emission intensity of the first cycle being defined as 100%, and at which the intensity of each of the organic light emitting devices of the other colors is within ±30% of the 99% as mentioned above.

Further, another more preferable position where the optical path difference becomes 2 L may be a position where the optical path difference becomes 2 L is a position which corresponds to a wavelength shorter by 40 to 83 nm than the crest peak wavelength, at which the emission intensity is 40 to 75% with the maximum emission intensity of the first cycle being defined as 100%, and at which the intensity of each of the organic light emitting devices of the other colors is within ±30% of the 75% as mentioned above, which is preferable from the viewpoint that the organic light emitting device array can be provided within an allowable error range during film formation.

As for an organic light emitting device array which fulfills either of the above described two kinds of numerical ranges, even when the array is viewed from a direction inclined at 60° relative to a direction perpendicular to a front face thereof, the CIE chromaticity coordinate for pure white color differs only by 0.05 or less in terms of x-coordinate and y-coordinate from that when the array is viewed from a direction perpendicular to the front face thereof respectively, and the luminances deviate only by 5% or less among the respective emission colors.

Further detailed explanation will be made below.

A position where the optical path difference of each of color organic light emitting devices of the present invention becomes 2 L may be out of the range of the positive gradient of the first cycle mentioned above. An example thereof will be described below.

Figure 3:
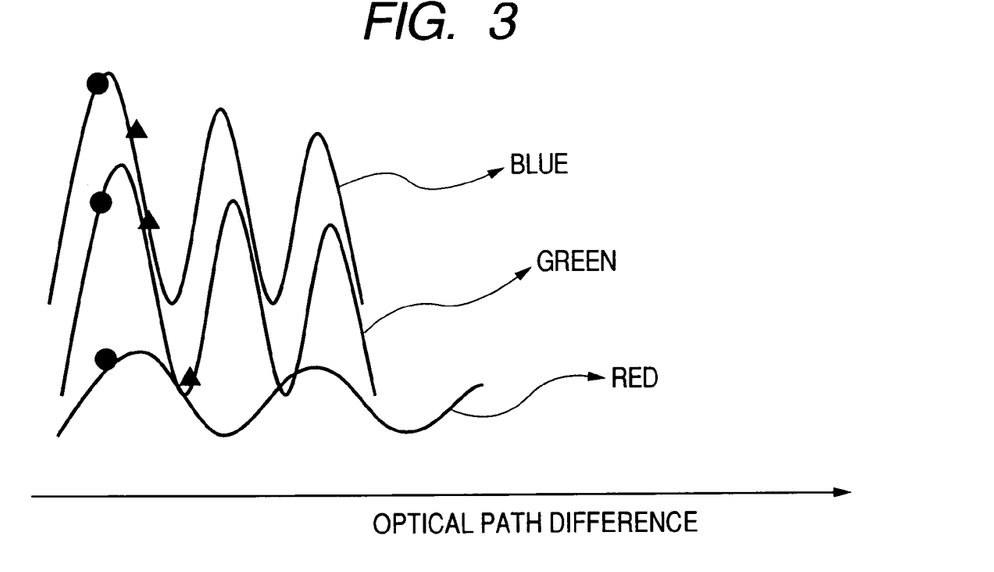
FIG. 3 is a graphic representation showing interferograms of respective organic light emitting devices of an organic light emitting device array in accordance with an embodiment of the present invention.

FIG. 3 shows a graph showing the interferograms of organic light emitting devices which emit lights of blue, green, and red, respectively as an example of the organic light emitting device array in accordance with this embodiment.

The figure is a graph which shows the interferograms of a blue light emitting device, a green light emitting device, and a red light emitting device, and is depicted with the abscissas (optical path differences) of the respective interferograms being unified. Further, it is to be noted that although the ordinate (not shown) indicates the interference light intensity in the figure, the graph reflects neither absolute values nor relative values of the interference light intensity among the respective colors.

Incidentally, in FIG. 3, an example of the above-described embodiment of being positioned in the positive gradient region of the first cycle is also shown by a solid circle. That is, for any one of the light emitting devices of different emission colors, the position where the optical path difference becomes 2 L is in the region of a positive gradient of the first cycle of the interferogram.

Although the wavelengths of crest peaks and trough bottoms of the interferograms of the blue light emitting device and the green light emitting device are near each other respectively, the crest peak and trough bottom of the red light emitting device are distant therefrom. For example, the crest peaks of the first cycle of the blue light emitting device and the green light emitting device are 115 nm and 132.5 nm respectively, and the crest peak of the red light emitting device is 162.5 nm. Further, the trough bottoms of the first cycle of the respective devices, i.e., $\frac{3}{4}\lambda$ are 230 nm, 265 nm, and 325 nm, respectively. The deviation of crest peaks or trough bottoms among the respective light emitting devices becomes large as the number of the cycles increases.

Hence, setting the position where the optical path difference of each light emitting device becomes 2 L within the first cycle is preferable from the viewpoint of preventing enlargement of deviations among the respective light emitting devices. Further, in the case of adopting such a structure, it is possible to make the distance d from a light emitting position to a reflective layer of each light emitting device, i.e., film thickness between the light emitting position and the reflective layer equal to each other. Hence, it is possible to provide a layer between the light emitting position and the reflective layer in common to the respective light emitting devices. Then, it is possible to provide an organic light emitting device array with a simpler structure.

As illustrate in FIG. 3, the expression that the gradient of an interferogram is negative means that the position where the optical path difference becomes 2 L is located as indicated by a solid triangle.

When the positions where the optical path difference becomes 2 L are located in the regions of a negative gradient of the interferograms, it is possible to display a slightly dark image without considerably changing the white balance even when viewed obliquely (difference in luminance among respective colors being 5% or less).

More further detailed explanation will be made below.

Figure 4:
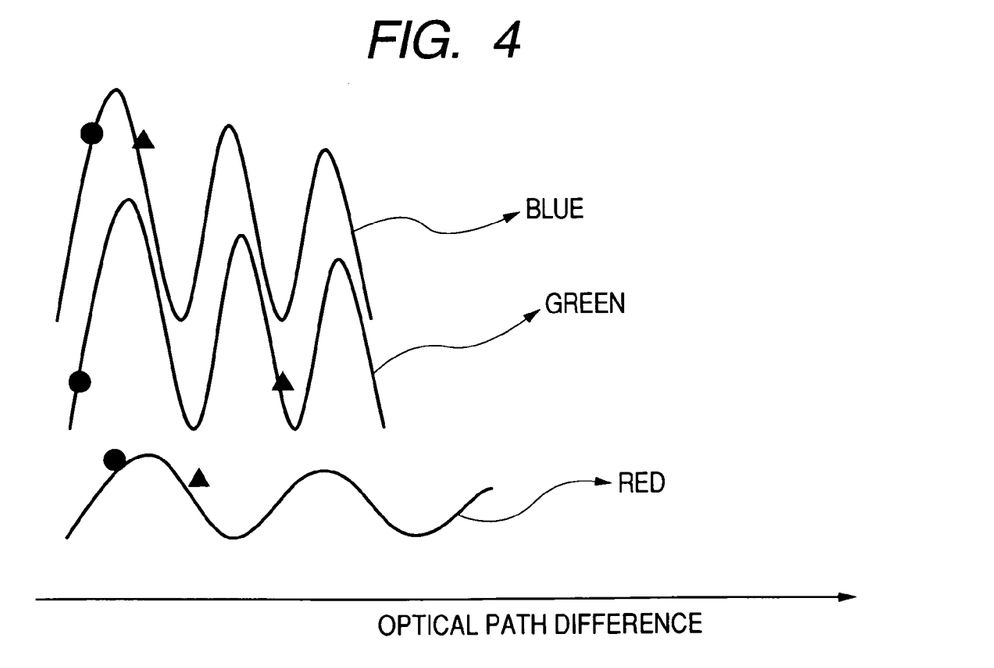
FIG. 4 is a graphic representation showing that the relative relationship between positions where optical path difference becomes 2 L of interferograms of respective organic light emitting devices is set so as to be different from that in FIG. 3.

FIG. 4 is a graphic representation showing that the relative relationship between positions where optical path difference becomes 2 L of interferograms of respective organic light emitting devices is set so as to be different from that in FIG. 3.

In the figure, two types of relationships of positions where optical path difference becomes 2 L are shown in interferograms. One type is shown by solid circles, and the other type is shown by solid triangles. Although the type shown by the solid circles has the same signs of gradients (positive in this case), a position where optical path difference becomes 2 L of at least one organic light emitting device is located in such a relationship with positions where optical path difference becomes 2 L of the other organic light emitting devices as to provide greatly different luminances. More specifically, the position where optical path difference becomes 2 L of a green light emitting device is so located in the interferogram as to provide a lower luminance.

On the other hand, although the type shown by the solid triangles has the same signs of gradients (negative in this case), a position where optical path difference becomes 2 L of at least one organic light emitting device is located in a cycle of an interferogram different from a cycle of interferograms in which positions where optical path difference becomes 2 L of the other organic light emitting devices are located. In the case shown in FIG. 4, a position where optical path difference becomes 2 L of a green light emitting device is set in a second cycle, and positions where optical path difference becomes 2 L of a blue light emitting device and a red light emitting device are set in a first cycle.

In this embodiment, it is also possible to provide an organic light emitting device array of the above described form.

Thus, as described above with reference to FIGS. 3 and 4, the setting of positions where optical path difference becomes 2 L of organic light emitting devices of respective colors of the organic light emitting device array of the present invention is designed as follows.

That is, it is preferable to set the optical path difference such that the signs of gradients at an optical path difference of 2 L of interferograms of the plurality of organic light emitting devices are all either positive or negative.

In order to perform display while maintaining the white balance without substantial difference in luminance among a red light emitting device, a green light emitting device, and a blue light emitting device when viewed obliquely (difference in luminance among respective colors being 5% or less), it is more preferable that positions where optical path difference becomes 2 L of the respective light emitting devices are located in the regions of a positive gradient.

So long as the signs of gradients at an optical path difference of 2 L of interferograms of the plurality of organic light emitting devices are set to be all either positive or negative, a cycle in which a position where optical path difference becomes 2 L is set of any organic light emitting device may differ from cycles in which positions where optical path difference becomes 2 L are set of the other organic light emitting devices.

Further, so long as the signs of gradients at an optical path difference of 2 L of interferograms of the plurality of organic light emitting devices are set to be all either positive or negative, the intensity at a position where optical path difference becomes 2 L of any organic light emitting device may differ by 50% or more from the intensities at positions where optical path difference becomes 2 L of the other organic light emitting devices.

In the organic light emitting device array as described above, a member disposed on the transmission side of a light emitting layer has a reflectance of less than 50%, and a difference between a CIE chromaticity coordinate for pure white color when the array is viewed from a direction perpendicular to a front face thereof and a CIE chromaticity coordinate for pure white color when the array is viewed from a direction inclined at 60° relative to the perpendicular direction is 0.05 or less in terms of x-coordinate and y-coordinate, respectively.

The feature that a member disposed on the transmission side of the light emitting layer has a reflectance of less than 50% means that the devices have no such translucent reflective layer as described in Japanese Patent Application Laid-Open No. 2002-367770 mentioned above. In particular, it is preferable in this embodiment to use a transparent electrode for an electrode on the light taking out side, and, for example, a transparent conductive material such as IZO and ITO may be used therefor. Thus, because a translucent reflective layer is not provided, any member with a reflectance of less than 50% is not provided on the light taking out side (light transmission side) of the light emitting layer. As mentioned above, as the transparent conductive material, it is possible to use known materials. That is, at an interface of the first electrode (transparent electrode) and an organic layer which is in contact with the first electrode, because it is possible to use a material of a reflectance of 5% or less for the first electrode, use of any transparent electrode which is specially designed is not required. A more preferable reflectance of the first electrode is 1% or less.

In addition, it is preferable that the second electrode provided on the light reflection side has a reflectance of 98% or more. More specifically, it is preferable to use an electrode which contains at least one of Cr and Ag, and more preferably, an electrode made of Cr or an electrode which contains Cr and Ag.

That is, with the organic light emitting device array in accordance with this embodiment, by controlling the film thickness of an organic layer, it is possible to reduce the change of white balance depending on the viewing angle, using conventional transparent electrodes and reflective electrodes without requiring use of a special member such as a translucent reflective layer. More specifically, it is possible to provide an organic light emitting device array in which a difference between a CIE chromaticity coordinate for pure white color when the array is viewed from a direction perpendicular to a front face thereof and a CIE chromaticity coordinate for pure white color when the array is viewed from a direction inclined at 60° relative to the perpendicular direction is 0.05 or less in terms of x-coordinate and y-coordinate, respectively.

Although description has been made by taking as an example an organic light emitting device array which is constituted of organic light emitting devices of three colors including a blue light emitting device, a green light emitting device, and a red light emitting device, the present invention is not limited to such structure. For example, the present invention may be applied to an organic light emitting device array which is constituted of organic light emitting devices of two colors of a blue light emitting device and an orange light emitting device, or an organic light emitting device array which is constituted of organic light emitting devices of four colors. That is, the present invention may be applied to any light emission through color mixing using a plurality of organic light emitting devices which emit lights of colors different from each other.

Further, in particular, when emitting white light, it is possible to combine white light emission through color mixing using a plurality of organic light emitting devices which emit lights of colors different from each other and white light emission using a white light emitting device which emits white light by itself. For example, it is possible to use an organic light emitting device array which has a red light emitting device, a green light emitting device, and a blue light emitting device that have the same signs of gradients at an optical path difference of 2 L of interferograms, and a white light emitting device that has any sign of gradient at an optical path difference of 2 L of interferogram.

Moreover, the organic light emitting device array in accordance with the present invention can be used for a display unit of various electronic devices such as a display unit of a digital camera, and a display unit of a television, a personal computer and the like.

EXAMPLES

Examples will be explained below.

Example 1

Figure 5:
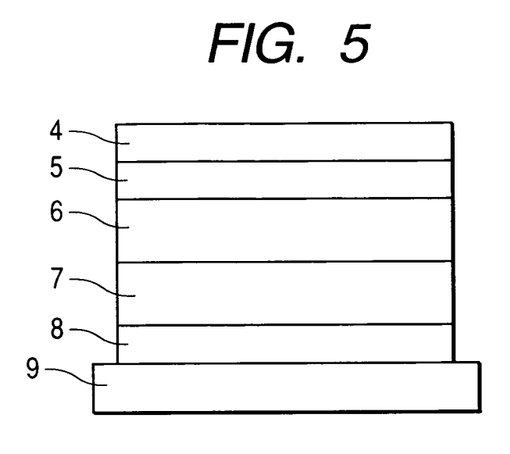
FIG. 5 is a schematic view showing a structure of an organic light emitting device.

An organic light emitting device array in accordance with this embodiment has a blue light emitting device, a green light emitting device, and a red light emitting device each having a structure as shown in FIG. 5.

Further, the optical path difference is set such that the signs of gradients at an optical path difference of 2 L of interferograms of the red light emitting device, the green light emitting device, and the blue light emitting device of the organic light emitting device array according to this embodiment are positive. Specifically, an anode 8 is formed of a reflective electrode, a hole transporting layer 7 is constituted of an organic layer with a refractive index n=1.8, and emitted light passes through a transparent cathode 4 to be taken out of the device. Incidentally, the hole transporting layer 7 is formed in a film thickness of 31 nm, and the optical path differences 2 L of the red light emitting device, the green light emitting device, and the blue light emitting device are all 112 nm.

In FIG. 5 reference number 5 is an electron transporting layer, reference number 6 is a light-emitting layer and reference number 9 is a glass substrate.

This means that as indicated by solid circles in FIG. 3, positions where optical path difference becomes 2 L of interferograms of the blue light emitting device, the green light emitting device, and the red light emitting device are each located in the region of a positive gradient in a first cycle.

Figure 6:
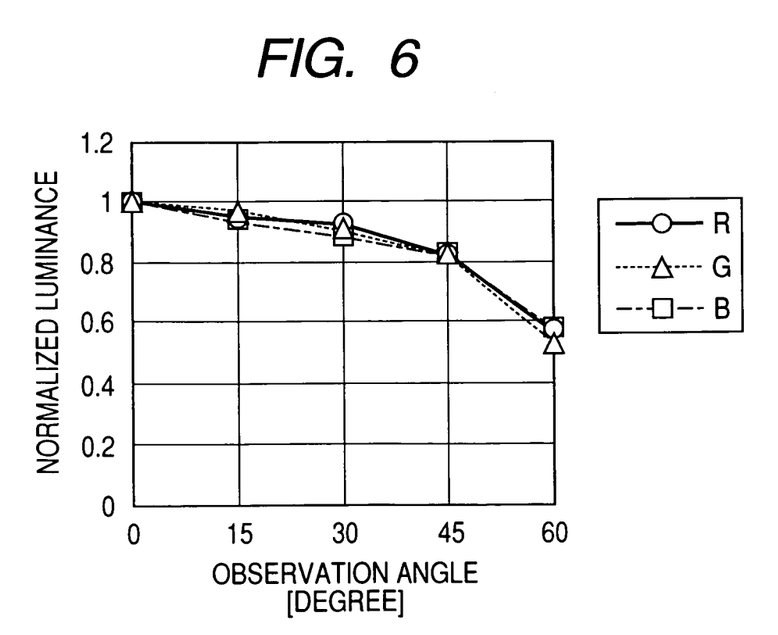
FIG. 6 is a graphic representation showing the relations between normalized luminances (or relative luminances) of respective organic light emitting devices and viewing angle in an organic light emitting device array in accordance with Example 1 of the present invention.

As a result, because the intensities (luminances) of the respective colors lower together as shown in FIG. 6 when the organic light emitting device array is viewed obliquely, it is possible to reduce the change of white balance depending on the viewing angle.

Hence, the above-described feature of making signs of gradients at optical path difference of 2 L of interferograms of respective organic light emitting devices identical to each other is preferable also from the viewpoint of preventing increase of deviation in intensity among the respective light emitting devices.

Figure 7:
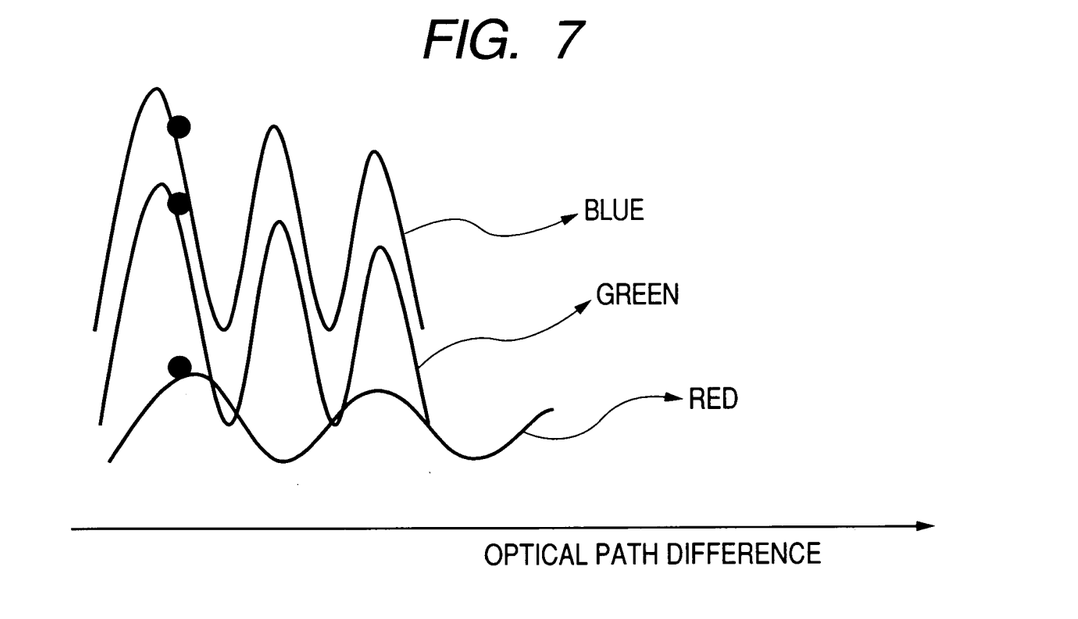
FIG. 7 is a graphic representation showing the relative relationship between positions where optical path difference becomes 2 L of interferograms of respective organic light emitting devices of an organic light emitting device array in accordance with a comparative example.

Next, a comparative example different from this embodiment will be described. In this comparative example, as indicated by solid circles in FIG. 7, positions where optical path difference becomes 2 L of a green light emitting device and a blue light emitting device of an organic light emitting device array are each located in a region with a negative gradient of interferogram, and a position where optical path difference becomes 2 L of a red light emitting device is located in a region with a positive gradient of interferogram. Specifically, the hole transporting layer 7 is formed in a film thickness of 42 nm, and the optical path differences 2 L of the red light emitting device, the green light emitting device, and the blue light emitting device are all 151 nm.

Figure 8:
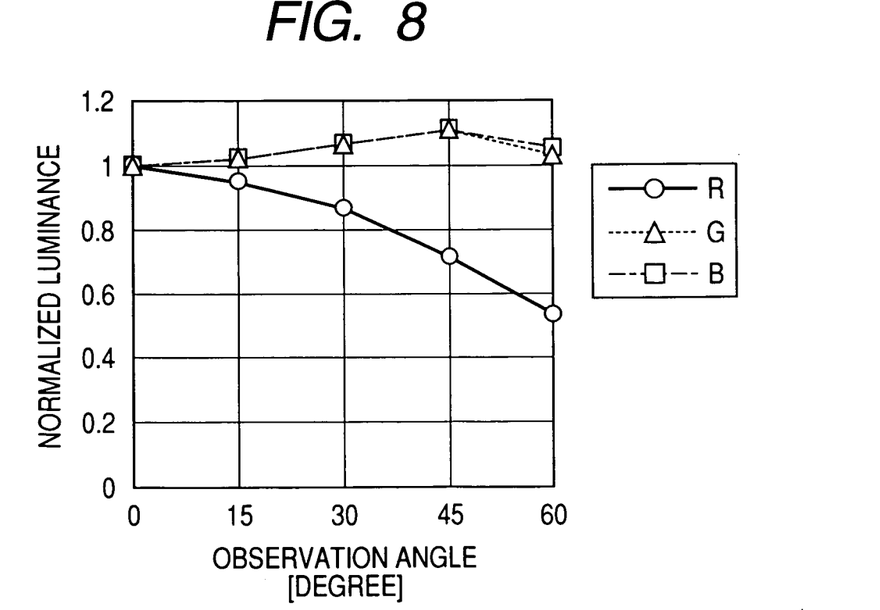
FIG. 8 is a graphic representation showing the relations between normalized luminances (or relative luminances) of respective organic light emitting devices and viewing angle in the organic light emitting device array according to another comparative example.

As a result, when the organic light emitting device array is viewed obliquely, because the intensities (luminances) for the green and the blue light emitting increase in a part of the viewing angle change and the intensity (luminance) of the red light emitting device decrease, as shown in FIG. 8, so that a change of white balance depending on the viewing angle arises to occur a color shift of white.

Hence, the above-described manner of making signs of gradients at optical path difference of 2 L of interferograms of respective organic light emitting devices different from each other is not preferable because of increasing deviation in intensity among the respective organic light emitting devices.

Example 2

An organic light emitting device array in accordance with this embodiment has a red light emitting device, a green light emitting device, and a blue light emitting device each having a structure as shown in FIG. 5.

Further, the optical path difference is set such that the signs of gradients at an optical path difference of 2 L of interferograms of the red light emitting device, the green light emitting device, and the blue light emitting device of the organic light emitting device array according to this embodiment are positive. Specifically, an anode 8 is formed of a reflective electrode, a hole transporting layer 7 is constituted of an organic layer with a refractive index n=1.8, and emitted light passes through a transparent cathode 4 to be taken out of the device. Incidentally, a hole transporting layer 7 of the green light emitting device is formed in a film thickness of 36 nm, a hole transporting layer 7 of the blue light emitting device is formed in a film thickness of 32 nm, and a hole transporting layer 7 of the red light emitting device is formed in a film thickness of 135 nm. Here, the optical path difference 2 L of the red light emitting device is 486 nm, the optical path difference 2 L of the green light emitting device is 130 nm, and the optical path difference 2 L of the blue light emitting device is 113 nm.

Figure 9:
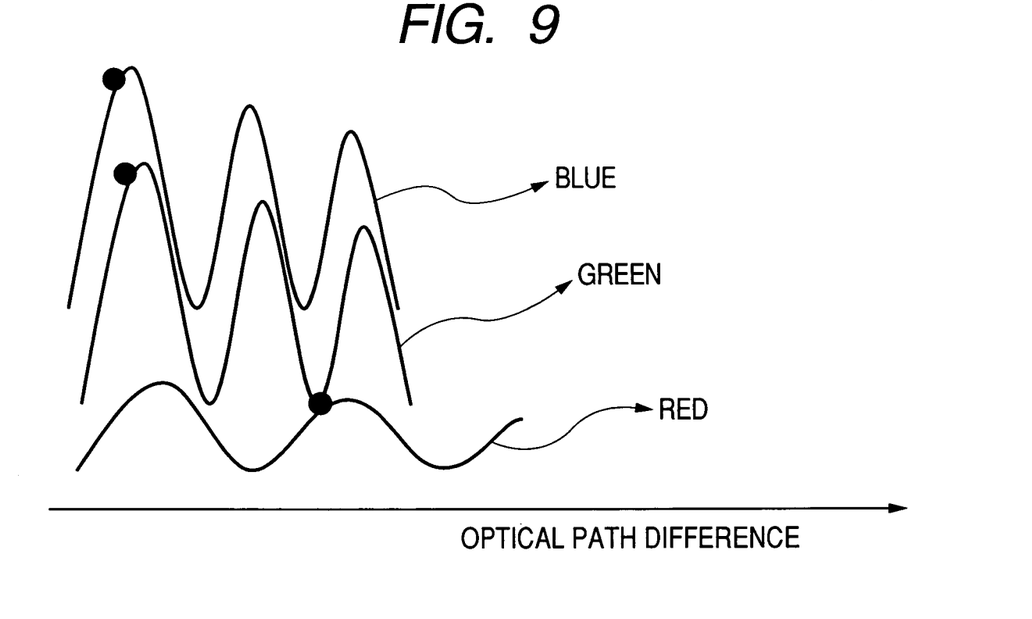
FIG. 9 is a graphic representation showing the relative relationship between positions where optical path difference becomes 2 L of interferograms of respective organic light emitting devices of an organic light emitting device array in accordance with Example 2.

This means that as indicated by solid circles in FIG. 9, positions where optical path difference becomes 2 L of interferograms of the green light emitting device and the blue light emitting device are each located in the region of a positive gradient in a first cycle, and a position where optical path difference becomes 2 L of interferogram of the red light emitting device is located in the region of a positive gradient in a second cycle.

Figure 10:
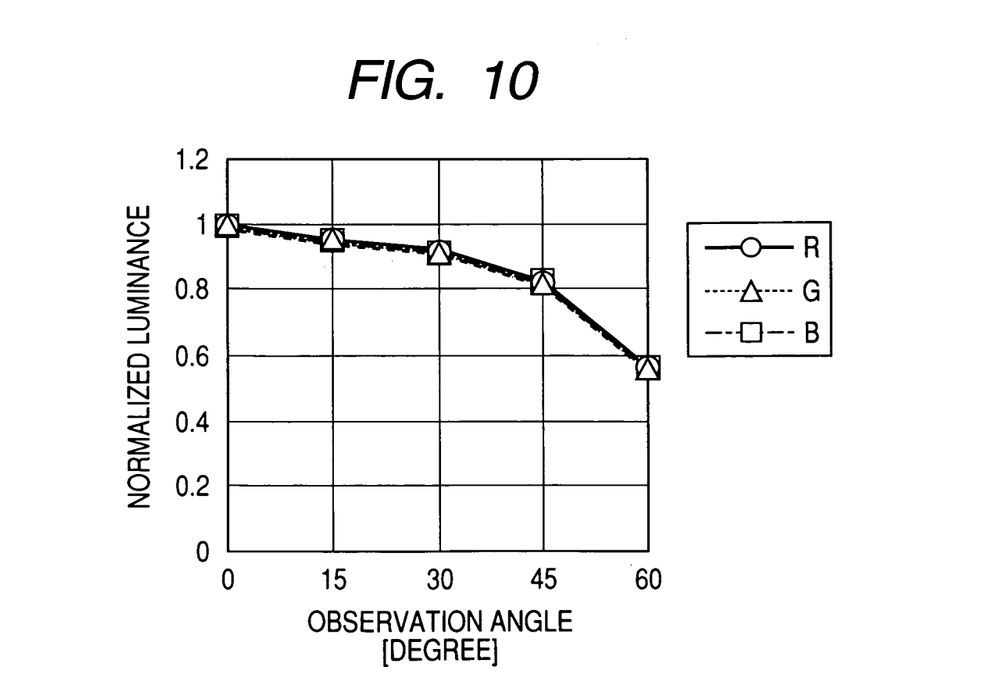
FIG. 10 is a graphic representation showing the relations between normalized luminances (or relative luminances) of respective organic light emitting devices and viewing angle in an organic light emitting device array according to Example 2 of the present invention.

As a result, because the intensities (luminances) of the respective colors lower together as shown in FIG. 10 when the organic light emitting device array is viewed obliquely, it is possible to reduce the change of white balance depending on the viewing angle.

Hence, the above-described feature of making signs of gradients at optical path difference of 2 L of interferograms of respective organic light emitting devices identical to each other is preferable also from the viewpoint of preventing increase of deviation in intensity among the respective light emitting devices.

This application claims priority from Japanese Patent Application Nos. 2004-309011 filed on Oct. 25, 2004 and 2005-302521 filed on Oct. 18, 2005, which are hereby incorporated by reference herein.

What is claimed is:

1. An organic light emitting device array comprising a plurality of organic light emitting devices of different emission light colors each comprising:
   a first electrode disposed on a transmission side;
   a second electrode disposed on a reflection side; and
   an organic light emitting layer disposed between the first and the second electrodes,
   wherein when an optical path between a light emitting position and a reflecting position on the reflection side is defined as L,
   a cycle of an interferogram starts at an optical path difference indicating a minimum value of the interferogram and ends at an optical path difference indicating a next minimum value of the interferogram,
   an optical path difference 2 L of each device is larger than an optical path difference indicating a minimum value of a cycle of an interferogram of each device and is smaller than an optical path difference indicating a maximum value of the same cycle of an interferogram of each device, or an optical path difference 2 L of each device is larger than an optical path difference indicating a maximum value of a cycle of an interferogram of each device and is smaller than an optical path difference indicating a next minimum value of the same cycle of an interferogram of each device, and
   wherein the first electrode has a reflectance of less than 50%.

2. The organic light emitting device array according to claim 1, wherein the reflecting position is at an interface on the transmission side of the second electrode which functions as a reflective electrode.

3. The organic light emitting device array according to claim 1, wherein the first electrode has a reflectance of 5% or less at an interface thereof on the organic light emitting layer side.

4. The organic light emitting device array according to claim 3, wherein the second electrode has a reflectance of 98% or more.

5. The organic light emitting device array according to claim 1, wherein the first electrode has a reflectance of 1% or less at an interface thereof on the organic light emitting layer side.

6. The organic light emitting device array according to claim 1, wherein film thicknesses between the light emitting position and the reflecting position of the plurality of organic light emitting devices are identical to each other.

7. The organic light emitting device array according to claim 1, wherein a layer is provided between the light emitting position and the reflecting position in common to the plurality of organic light emitting devices.

8. A display comprising the organic light emitting device array set forth in claim 1 in a display unit thereof.

9. A digital camera comprising the organic light emitting device array set forth in claim 1 in a display unit thereof.

10. The organic light emitting device array according to claim 1, wherein the optical path difference 2 L of each of the devices is smaller by 1 nm or more and 83 nm or less than an optical path difference indicating a maximum value of a cycle of an interferogram of each of the devices.

11. An organic light emitting device array comprising a plurality of organic light emitting devices of different emission light colors each comprising:
 a first electrode disposed on a transmission side;
 a second electrode disposed on a reflection side; and
 an organic light emitting layer disposed between the first and the second electrodes,
 wherein when an optical path between a light emitting position and a reflecting position on the reflection side is defined as L,
 a cycle of an interferogram starts at an optical path difference indicating a minimum value of the interferogram and ends at an optical path difference indicating a next minimum value of the interferogram,
 an optical path difference 2 L of each device is larger than an optical path difference indicating a minimum value of a cycle of an interferogram of each device and is smaller than an optical path difference indicating a maximum value of the same cycle of an interferogram of each device, or an optical path difference 2 L of each device is larger than an optical path difference indicating a maximum value of a cycle of an interferogram of each device and is smaller than an optical path difference indicating a next minimum value of the same cycle of an interferogram of each device, and
 wherein the optical path difference 2 L of each of the devices is smaller by 1 nm or more and 83 nm or less than an optical path difference indicating a maximum value of a cycle of an interferogram of each of the devices.

12. The organic light emitting device array according to claim 11, wherein the optical path difference 2 L of each of the devices is smaller by 40 nm or more and 83 nm or less than an optical path difference indicating a maximum value of a cycle of an interferogram of each of the devices.

13. The organic light emitting device array according to claim 11, wherein the first electrode has a reflectance of less than 50%.

14. The organic light emitting device array according to claim 13, wherein the first electrode has a reflectance of 5% or less at an interface thereof on the organic light emitting layer side.

15. The organic light emitting device array according to claim 11, wherein the second electrode has a reflectance of 98% or more.

16. The organic light emitting device array according to claim 11, wherein the first electrode has a reflectance of 1% or less at an interface thereof on the organic light emitting layer side.

17. The organic light emitting device array according to claim 11, wherein film thicknesses between the light emitting position and the reflecting position of the plurality of organic light emitting devices are identical to each other.

18. The organic light emitting device array according to claim 11, wherein a layer is provided between the light emitting position and the reflecting position in common to the plurality of organic light emitting devices.

19. A display comprising the organic light emitting device array set forth in claim 11 in a display unit thereof.

20. A digital camera comprising the organic light emitting device array set forth in claim 11 in a display unit thereof.

* * * * *